United States Patent
Fan

(10) Patent No.: US 8,493,248 B2
(45) Date of Patent: Jul. 23, 2013

(54) TRANSFORMING CIRCUIT AND SYSTEM BETWEEN PARALLEL DATA AND SERIAL DATA

(75) Inventor: Fangping Fan, Chengdu (CN)

(73) Assignee: IPGoal Microelectronics (SiChuan) Co., Ltd., Chengdu, Sichuan Province (CN)

( * ) Notice: Subject to any disclaimer, the term of this patent is extended or adjusted under 35 U.S.C. 154(b) by 0 days.

(21) Appl. No.: 13/452,948

(22) Filed: Apr. 23, 2012

(65) Prior Publication Data

US 2012/0280839 A1    Nov. 8, 2012

(30) Foreign Application Priority Data

May 3, 2011   (CN) .......................... 2011 1 0112285

(51) Int. Cl.
*H03M 9/00*    (2006.01)
(52) U.S. Cl.
USPC .......................................... 341/101; 341/144
(58) Field of Classification Search
USPC .................................. 341/100–101
See application file for complete search history.

(56) References Cited

U.S. PATENT DOCUMENTS

| | | | | |
|---|---|---|---|---|
| 6,188,339 B1 * | 2/2001 | Hasegawa | ...................... | 341/101 |
| 6,417,790 B1 * | 7/2002 | Fiedler et al. | .................. | 341/101 |
| 7,460,039 B2 * | 12/2008 | Jeon | .............................. | 341/100 |
| 7,796,064 B2 * | 9/2010 | Kim et al. | ..................... | 341/101 |
| 7,821,429 B2 * | 10/2010 | Yu et al. | ........................ | 341/101 |

* cited by examiner

*Primary Examiner* — Khai M Nguyen

(57) ABSTRACT

A transforming circuit between parallel data and serial data includes a current source, a clock input sub-circuit, and a parallel data input sub-circuit. The clock input sub-circuit includes a first clock signal terminal and a second clock signal terminal. The transforming circuit between parallel data and serial data also includes a clock control sub-circuit and a serial data output control sub-circuit. The clock control sub-circuit includes four switching elements. A first and a third switching elements are controlled by the second clock signal terminal, and a second and a fourth switching elements are controlled by the first clock signal terminal. The serial data output control sub-circuit includes a fifth switching element and a sixth switching element to speed up the falling edge of the output signal flip, a seventh switching element and an eighth switching element to limit the output signal amplitude. A transforming system thereof is also provided.

10 Claims, 3 Drawing Sheets

TRANSFORMING CIRCUIT AND SYSTEM BETWEEN PARALLEL DATA AND SERIAL DATA

BACKGROUND OF THE PRESENT INVENTION

1. Field of Invention

The present invention relates to a data converting circuit and a data converting system, which is a simple specific structure with moving down function of intersection.

2. Description of Related Arts

Transforming circuit between parallel data and serial data is to convert two parallel data to one serial data. FIG. 1 is the traditional transforming circuit between parallel data and serial data, A1 and B1 are two parallel data, A1 and A1_N are differential signal, B1 and B1_N are differential signal, CLK and CLKN are sampling clock signal and inverted with each other. A_OUT and B_OUT are serial output signal. As the intersection A_OUT and B_OUT is difficult to control, when charging too fast, while the discharge is too slow, the intersection of A_OUT and B_OUT is too high, it will cause the overswing in the output of the next stage while driving the next stage. Therefore, to resolve this problem, it is need to move down the intersection to avoid the overswing in the next stage.

SUMMARY OF THE PRESENT INVENTION

An object of the present invention is to provide a simple transforming circuit and a transforming system between parallel data and serial data with the moving down function of intersection.

The transforming circuit between parallel data and serial data to convert parallel data to serial data includes a current source, a clock input sub-circuit electrically connect with the current source, and a parallel data input sub-circuit electrically connect with the clock input sub-circuit.

The clock input sub-circuit including a first clock signal terminal and a second clock signal terminal. the first and second signal terminal are inverted clock each other; the transforming circuit between the parallel data and serial data also including a serial data output control sub-circuit electrically connect with the parallel data input circuit; a clock control sub-circuit electrically connect with the serial data output control sub-circuit and the clock input sub-circuit; the clock control sub-circuit comprising a first switching element; a second switching element; a third switching element, and a fourth switching element; wherein the first switching element and the third switching element are controlled by the second clock signal terminal, the second switching element and the fourth switching element are controlled by the first clock signal terminal; wherein the serial data output control sub-circuit comprising: a fifth switching element and a sixth switching element to accelerate output data falling edge invert; a seventh switching element and an eighth switching element to limit input data amplitude.

Another object of the present invention is to provide a transforming system between parallel data and serial data, to convert parallel data to serial data, comprising a current source, a clock input sub-circuit electrically connect with the current source, and a parallel data input sub-circuit electrically connect with the clock input sub-circuit. The transforming system between parallel data and serial data also includes a serial data output control sub-circuit electrically connect with the parallel data input sub-circuit; a clock control sub-circuit electrically connect with the clock input sub-circuit and the serial data output control sub-circuit. The clock control sub-circuit includes a pair of sampling clock signal input; the parallel data input sub-circuit includes two parallel data input; the clock control sub-circuit adjust output signal intersection voltage by adjusting the output signal rise and fall times of the serial data output sub-circuit; the serial data output control sub-circuit outputs an post-adjust serial data.

Accordingly, in order to accomplish the above objects, the present invention of a transforming circuit and system between parallel data and serial data provides a simple structure, suppressing overswing in the next stage, effectively suppressing the interference from the power, less noise; utilizing the differential structure that can suppress common-mode noise, with high power supply rejection ratio (PSRR) and common-mode rejection ratio (CMRR).

These and other objectives, features, and advantages of the present invention will become apparent from the following detailed description, the accompanying drawings, and the appended claims.

DETAILED DESCRIPTION OF THE PREFERRED EMBODIMENT

Figure 1:
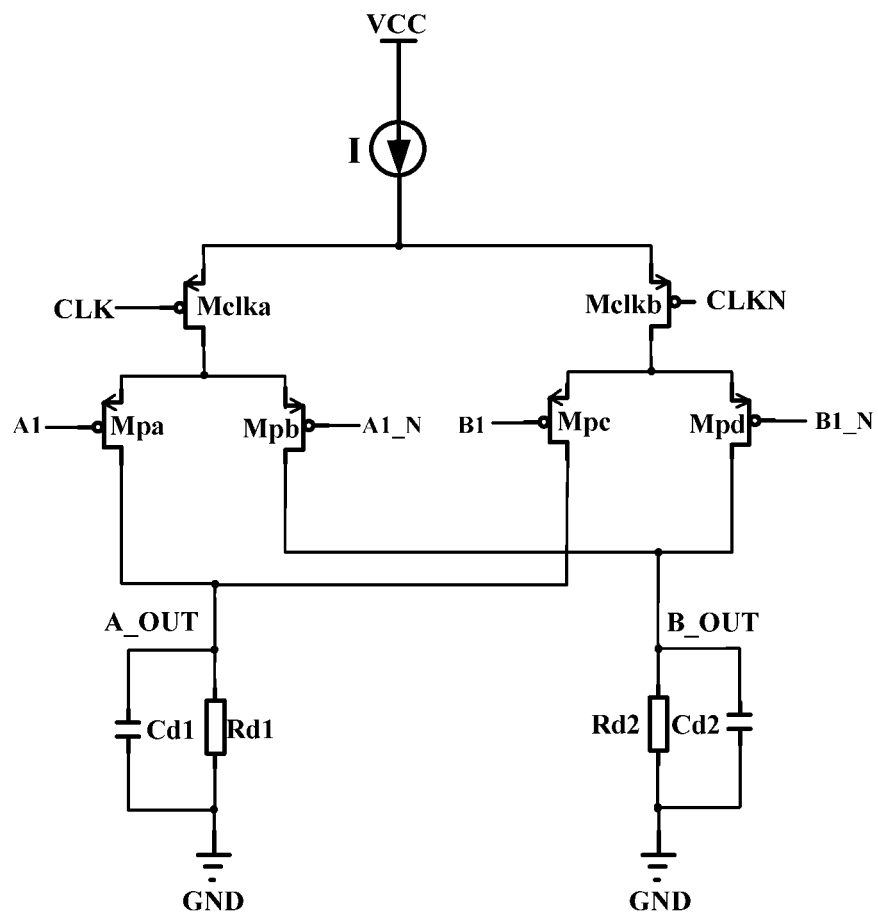
FIG. 1 shows the existing transforming circuit between parallel data and serial data.
Figure 2:
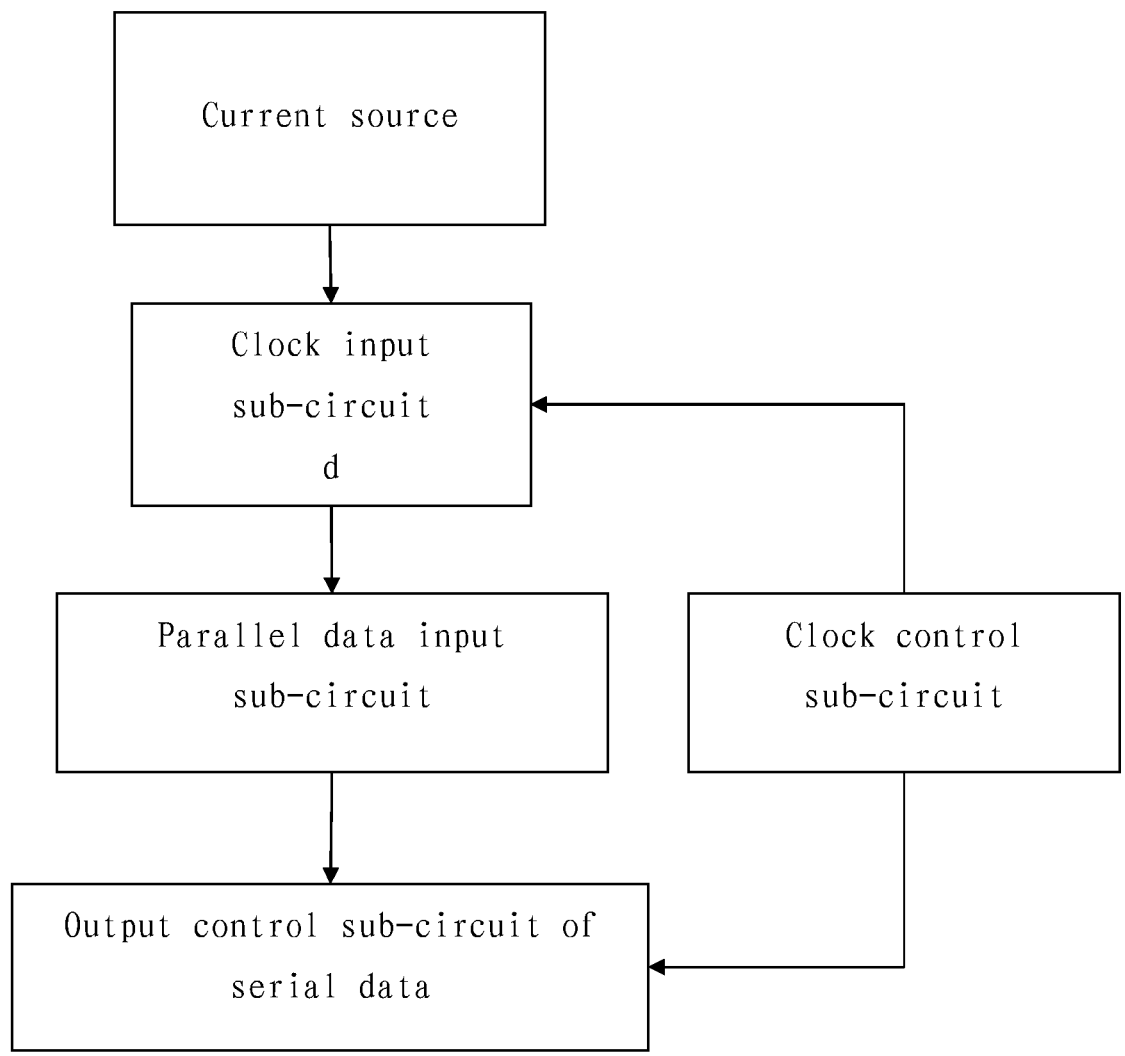
FIG. 2 shows the system frame of the present invention transforming system between parallel data and serial data.
Figure 3:
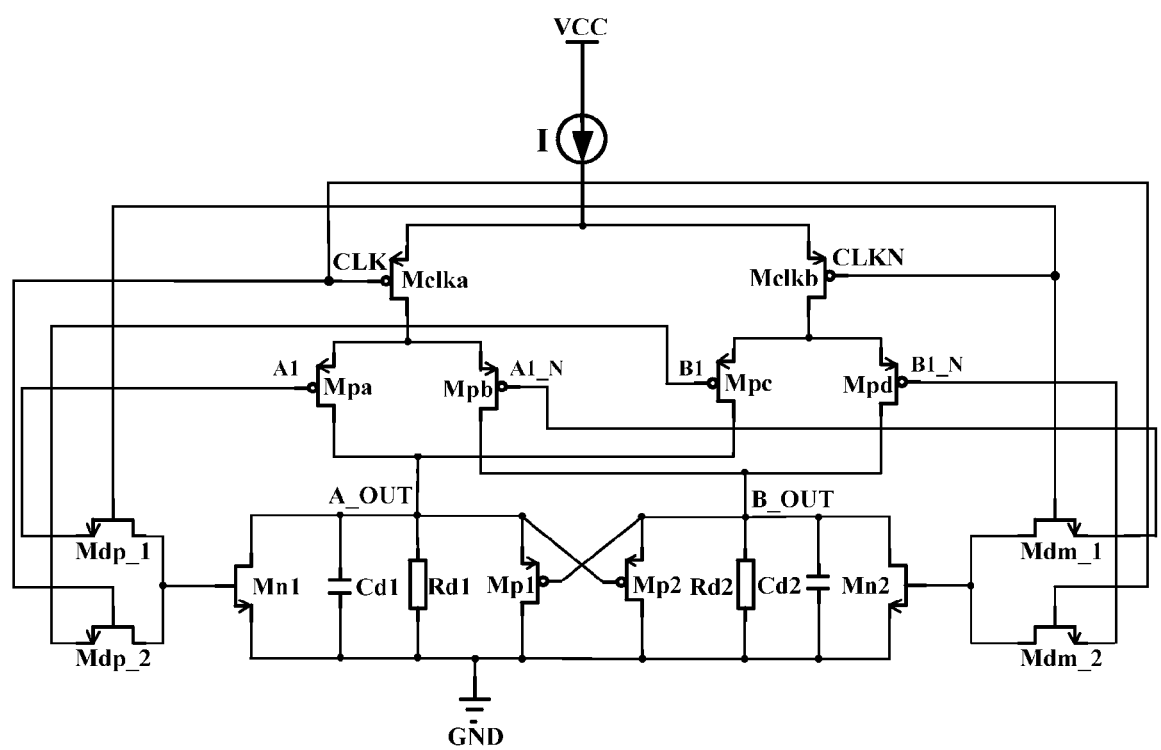
FIG. 3 shows the circuit of the present invention transforming circuit between parallel data and serial data.

Referring to FIG. 1 and FIG. 2, accordingly a preferred embodiment of the present invention is illustrated which comprises a current source I, a lock input sub-circuit electrically connect with the current source I, a parallel data input sub-circuit electrically connect with the clock input sub-circuit, a serial data output control sub-circuit electrically connect with the parallel data input sub-circuit, and a clock control sub-circuit electrically connect with the clock input sub-circuit and the serial data output control sub-circuit.

An embodiment of the present invention, the clock input sub-circuit includes a first clock signal terminal CLK, a first clock signal switching element electrically connect with the first clock signal terminal CLK, a second clock signal terminal CLKN, and a second clock signal switching element electrically connect with the second clock signal terminal CLKN.

The parallel data input sub-circuit includes a first data input terminal A1, a second data input terminal B1, a third data input terminal A1_N, a fourth data input terminal B1_N, a first input switching element electrically connect with the first data input terminal A1, a second input switching element electrically connect with the second data input terminal B1, a third input switching element electrically connect with the third data input terminal A1_N, and a fourth input switching element electrically connect with the fourth data input terminal B1_N; the clock control sub-circuit includes a first switching element electrically connect with the first data input terminal A1 and the second clock signal terminal CLKN, a second switching element electrically connect with the second data input terminal B1 and the first clock signal terminal CLK, a third switching element electrically connect with the third data input terminal A1_N and the second clock signal terminal CLKN, and a fourth switching element electrically connect with the fourth data input terminal B1_N and the first clock signal terminal CLK.

The serial data output control sub-circuit includes a fifth switching element, a sixth switching element, a seventh switching element, an eighth switching element, a first capacitance Cd1, a second capacitance Cd2, a first fuse Rd1, a second fuse Rd2, a first data output terminal A_OUT, and a second data output terminal B_OUT;

The first data input terminal A1 and the second data input terminal B1 input two parallel data; the data inputted from the first data input terminal A1 and the data inputted from the third data input terminal A1_N are a pair of differential signal; the data inputted from the second data input terminal B1 and the data inputted from the fourth data input terminal B1_N are a pair of differential signal; sampling clock signal from the first clock signal terminal CLK and the second clock signal terminal CLKN are inverted each other; the first data output terminal A_OUT output a serial data, the data outputted from the second data output terminal B_OUT and the data outputted from the first data output terminal A_OUT are a pair of different signal.

In the embodiment, the first clock signal switching element is a FET Mclka controlled by the first clock signal terminal CLK; the second clock signal switching element is a FET Mclkb controlled by the second clock signal terminal CLKN; the first input switching element is a FET Mpa controlled by the first data input terminal A1; the second input switching element is a FET Mpb controlled by the third data input terminal A1_N; the third input switching element is a FET Mpc controlled by the second data input terminal B1; the fourth input switching element is a FET Mpd controlled by the fourth data input terminal B1_N; the first switching element is first FET Mdp_1, the second switching element is second FET Mdp_2, the third switching element is third FET Mdm_1, the fourth switching element is fourth FET Mdm_2, the fifth switching element is fifth FET Mn1, the sixth switching element is sixth FET Mn2, the seventh switching element is seventh FET Mp1, the eighth switching element is eighth FET Mp2; the FET Mclka, the FET Mclkb, the FET Mpa, the FET Mpb, the FET Mpc, the FET Mpd, the seventh FET Mp1 and the eighth FET Mp2 are P-FET (PMOS); the first FET Mdp_1, the second FET Mdp_2, the third FET Mdm_1, the fourth FET Mdm_2, the fifth FET Mn1 and the sixth FET Mn2 are N-FET (NMOS). It is to be understood that there are other embodiments within the scope of the present invention, where the switching element can be replaced with other switching components or circuitries that can realize the similar function.

In a preferred embodiment of the present invention: the first data input terminal A1 electrically connects with FET Mpa gate and the source of the first FET Mdp_1; the source of the FET Mpa and the source of the FET Mpb electrically connects with the drain of the FET Mclka; the drain of FET Mpa, the drain of FET Mpc, the drain of the fifth FET Mn1, a terminal of the first capacitance, a terminal of the first fuse, the source of the seventh FET Mp1, and the gate of the eighth FET Mp2 electrically connects together with the first data output terminal of A_OUT; the third data input terminal A1_N electrically connects with the gate of the FET Mpb and the source of the third FET Mdm_1; the drain of the FET Mpb, the drain of the FET Mpd, the drain of the sixth FET Mn2, a terminal of the second capacitance Cd2, an terminal of the second fuse Rd2, the source of the eighth FET Mp2, and the gate of the seventh FET Mp1 electrically connects together with the second data output terminal B_OUT.

The second data input terminal B1 electrically connects with the gate of the FET Mpc and the source of the second Mdp_2; the source of the FET Mpc and the source of the FET Mpd electrically connect together with the drain of the FET Mclkb; the fourth data input terminal B1_N electrically connect with the gate of the FET Mpd and the source of the fourth FET Mdm_2.

The first clock signal terminal CLK electrically connects with the gate of the FET Mclka, the gate of the second FET Mdp_2, and the gate of the fourth FET Mdm_2; the second clock signal terminal CLKN electrically connects with the gate of the FET Mclkb and the gate of the third FET Mdm_1; the source of the FET Mclka and the source of the FET Mclkb electrically connect together with a terminal of the current source I, the other terminal of the current source I electrically connects with a power source VCC terminal; the drain of the first FET Mdp_1 and the drain of the second FET Mdp_2 electrically connect together with the gate of the fifth FET Mn1; the drain of the third FET Mdm_1 and the drain of the fourth FET Mdm_2 electrically connect together with the gate of the sixth FET Mn2.

The source of the fifth FET Mn1, the other terminal of the first capacitance Cd1, the other terminal of the first fuse Rd1, the drain of the seventh FET Mp1, the drain of the eighth FET Mp2, the other terminal of the second fuse Rd2, the other terminal of the second capacitance, and the source of the sixth FET Mn2 electrically connect together with ground.

In comparison, FIG. 1 showing the existing transforming circuit between parallel data and serial data, the embodiment of the present invention, has the fifth FET Mn1, the sixth FET Mn2, the seventh FET Mp1, the eighth FET Mp2 and four FET controlled by the clock, which are the first FET Mcp_1, the second FET Mdp_2, the third FET Mcm_1, and the fourth FET Mdm_2. The fifth FET Mn1 and the sixth FET Mn2 are designed to speed up output signal falling edge flip which are outputted from the first output terminal A_OUT and the second output terminal B_OUT; the seventh FET Mp1 and the eighth FET Mp2 can limit signal amplitude that outputted from the first output terminal A_OUT and the second output terminal B_OUT to suppress intersymbol interference (ISI).

In the present invention, the assumption is that the capacity value of the first capacitance Cd1 and the second capacitance Cd2 are equal as Cd.

When the first clock signal terminal CLK input is low level data "0", the second clock signal terminal CLKN input high level data "1", data inputted from the first data input terminal A1 and the third data input terminal A1_N is effective, data inputted from the second data input terminal B1 and the fourth data input terminal B1_N is masked, at this point, the first FET Mdp_1 and the third FET Mdm_1 are on, the second FET Mdp_2 and the fourth FET Mdm_2 are off; the first data output terminal A_OUT and the second data output terminal B_OUT respectively transmit data from the first data input terminal A1 and the third data input terminal A1_N. When the first data input terminal A1 input high level data "1", the third data input terminal A1_N input low level data "0", the FET Mpb is on, the sixth FET Mn2 is off, all of the current of the current source I flow through the FET Mpb and charge the second capacitance Cd2, the conversion rate is I/Cd, at the same time the FET Mpa is off and the fifth FET Mn1 is on, the first capacitance Cd1 discharge through the first fuse Rd1 and the fifth FET Mn1, discharging current is I1=IMn1+IRd1, where IMn1 is the current flow through the fifth FET Mn1, IRd1 is the current flow through the first fuse Rd1, the conversion rate is I1/Cd. Therefore, rise and fall times of the output signal outputted from the first data output terminal A_OUT and the second data output terminal B_OUT can be adjusted by regulating the current of the current source I and the current I1, and then adjust intersection voltage. At the same time, to suppress intersymbol interference, the embodiment the seventh FET Mp1 and the eighth FET Mp2 to limit instant signal level, so as to reach a consistent similar high level signal "1" for the Vout+.Vout− at different frequencies.

When clock signal inputted from the first clock signal terminal CLK is high level, clock signal inputted from the second clock signal terminal CLKN is low level, data at the second data input terminal B1 and the fourth data input terminal B1_N is effective, data at the first data input terminal A1 and data at the third data input terminal A1_N is masked, at the same time, the second FET Mdp_2 and the fourth FET Mdm_2 are on, the first FET Mdp_1 and the third FET Mdm_1 are off; the first data output terminal A_OUT and the second data output terminal B_OUT transmit data inputted from the second data input terminal B1 and the fourth data input terminal B1_N.

When the second data input terminal B1 input high level data "1", the fourth data input terminal B1_N input low level data "0", the FET Mpd is on, the sixth FET Mn2 is off, all of the current of the current source I flows through the FET Mpd and charges the second capacitance Cd2; the conversion rate is I/Cd; at the same time the FET Mpc is off and the fifth FET Mn1 is on; the first capacitance Cd1 discharge through the first fuse Rd1 and the fifth FET Mn1; discharging current is I1=IMn1+IRd1, where IMn1 is the current flow through the fifth FET Mn1; IRd1 is the current flow through the first fuse Rd1; the conversion rate is I1/Cd. Therefore, rise and fall times of the output signal outputted from the first data output terminal A_OUT and the second data output terminal B_OUT can be adjusted by regulating the current of the current source I and the current source I1 to adjust intersection voltage. At the same time, to suppress intersymbol interference, the embodiment provides the seventh FET Mp1 and the eighth FET Mp2 to limit instant signal level, so as to reach a consistent similar high level signal "1" for the Vout+.Vout− at different frequencies.

The present invention transforming circuit and system between parallel data and serial data has a simple structure with moving down function of intersection which is lacked in the existing transforming circuit and system, and then suppress the overswing of the output of the next output stage, such function is much obvious when in driving a transforming circuitry with a large driving current; the present invention provides a simple structure, suppressing overswing in the next stage, effectively suppressing the interference from the power, less noise; utilizing the differential structure that can suppress common-mode noise, with high power supply rejection ratio (PSRR) and common-mode rejection ratio (CMRR).

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A transforming circuit between parallel data and serial data to convert parallel data to serial data, comprising:
    a current source;
    a clock input sub-circuit electrically connect to the current source; and
    a parallel data input sub-circuit electrically connect to the clock input sub-circuit;
    wherein the clock input sub-circuit includes
    a first clock signal terminal; and
    a second clock signal terminal, wherein the first and second signal terminal are inverted clock each other;
    the transforming circuit between the parallel data and serial data further including
    a serial data output control sub-circuit electrically connect with the parallel data input circuit;
    a clock control sub-circuit electrically connect with the serial data output control sub-circuit and the clock input sub-circuit;
    wherein the clock control sub-circuit comprises:
    a first switching element;
    a second switching element;
    a third switching element, and
    a fourth switching element;
    wherein the first switching element and the third switching element are controlled by the second clock signal terminal; wherein the second switching element and the fourth switching element are controlled by the first clock signal terminal;
    wherein the serial data output control sub-circuit comprises:
    a fifth switching element and a sixth switching element to speed up output data falling edge flip;
    a seventh switching element and
    an eighth switching element to limit input data amplitude.

2. The transforming circuit between parallel data and serial data, as recited in claim 1, comprising:
    the clock input sub-circuit including a clock signal switching element electrically connect with the first clock signal terminal and a second clock signal switching element electrically connect with the second clock signal terminal;
    wherein the parallel data input sub-circuit includes
    a first data input terminal,
    a second data input terminal,
    a third data input terminal, and
    a fourth data input terminal,
    a first input switching element electrically connect with the first data input terminal,
    a second input switching element electrically connect with the second data input terminal,
    a third input switching element electrically connect with the third data input terminal, and
    a fourth data input switching element electrically connect with the fourth data input terminal;
    wherein the first switching element electrically connect with the first data input terminal and the second clock signal terminal; wherein the second switching element electrically connect with the second data input terminal and the first clock signal terminal; wherein the third switching element electrically connect with the third data input terminal and the second clock signal terminal; wherein the fourth switching element electrically connect with the fourth data input terminal and the first clock signal terminal;
    wherein the serial data output control sub-circuit includes:
    a first capacity,
    a second capacity,
    a first fuse,
    a second fuse,
    a first data output terminal, and
    a second data output terminal.

3. The transforming circuit between parallel data and serial data, as recited in claim 2, further comprising:

two parallel data inputted from the first data input terminal and the second data input terminal;

differential signal inputted from the first data input terminal and the third data input terminal;

differential signal inputted from the second data input terminal and the fourth data input terminal;

a serial data outputted from the first and the second data output terminal;

wherein the first clock signal switching element is a field effect transistor Mclka;

wherein the second clock signal switching element is a field effect transistor Mclkb;

wherein the first input switching element is a field effect transistor Mpa;

wherein the second input switching element is a field effect transistor Mpb;

wherein the third input switching element is a field effect transistor Mpc;

wherein the fourth input switching element is a field effect transistor Mpd;

wherein the first switching element is a first field effect transistor Mdp_1;

wherein the second switching element is a second field effect transistor Mdp_2;

wherein the third switching elements is a third field effect transistor Mdm_1;

wherein the switch components is a fourth field effect transistor Mdm_2;

wherein the fifth switching element is a fifth field effect transistor Mn1;

wherein the sixth switching element is a sixth field effect transistor Mn2, the seventh switching element 7 is field effect transistor Mp1; wherein the eighth switching element is an eighth field effect transistor Mp2.

4. The transforming circuit between parallel data and serial data, as recited in claim 3:

wherein the first data input terminal connect with the Mpa gate of FET and the source level of the first FET Mdp_1;

wherein both the source level of the FET Mpa and the FET Mpb connect with a drain of the FET Mclka, wherein the drain of the FET Mpa, FET Mpc, the fifth FET Mn1, a terminal of the first capacity, a terminal of the first fuse, the source level of the seventh FET Mp1 and the gate of the eighth FET Mp2 connect with the first data output terminal.

5. The transforming circuit between parallel data and serial data, as recited in claim 4:

wherein the third data input terminal electrically connect with the gate of the FET Mpb and the source of the third FET Mdm_1; wherein the drain of FET Mpb, the drain of FET Mpd, the drain of the sixth FET Mn2, a terminal of the second capacity, a terminal of the second fuse, the source of the eighth FET Mp2, and the gate of the seventh FET Mp1 electrically connect together with the second data output terminal.

6. The transforming circuit between parallel data and serial data, as recited in claim 5:

wherein the second data input terminal electrically connects with the gate of FET Mpc and the source of the second FET Mdp_2;

wherein the source of the FET Mpc and the source of the FET Mpd electrically connect with the gate of the FET Mclkb;

wherein a fourth data input terminal B1_N electrically connect with the gate of the FET Mpd and the source of the fourth FET Mdm_2.

7. The transforming circuit between parallel data and serial data, as recited in claim 6:

wherein the first signal terminal electrically connects with the gate of the FET Mclka, the gate of the second FET Mdp_2, and the gate of the fourth FET Mdm_2;

wherein the second clock signal terminal electrically connects with the gate of the FET Mclkb, the gate of the first FET Mdp_1, and the gate of the third FET Mdm_1;

wherein the source of FET Mclka and the source of the FET Mclkb electrically connect with one terminal of the current source, the other terminal of the current source connect with a power source.

8. The transforming circuit between parallel data and serial data, as recited in claim 7:

wherein the drain of the first FET Mdp_1 and the drain of the second FET Mdp_2 electrically connect with the gate of the fifth FET Mn1;

wherein the drain of third FET Mdm_1 and the drain of the fourth FET Mdm_2 electrically connect with the gate of the sixth FET Mn2;

wherein the source of the fifth FET Mn1, the other terminal of the first capacity, the other terminal of the first fuse, the drain of the seventh FET Mp1, the drain of the eighth FET Mp2, the other terminal of the second fuse, the other terminal of the second capacity, and the source of the sixth FET Mn2 electrically connect together ground.

9. A transforming system between parallel data and serial data to convert parallel data to serial data, comprising:

a source;

a clock input sub-circuit electrically connect with the source; and a parallel data input sub-circuit electrically connects with the clock input sub-circuit;

wherein a serial data output control sub-circuit electrically connects with the parallel data input sub-circuit;

wherein a clock control sub-circuit electrically connects with the clock input sub-circuit and the serial data output control sub-circuit;

wherein the clock control sub-circuit receives a pair of sampling clock signal input;

wherein the parallel data input sub-circuit receives two parallel data inputs;

wherein the clock control sub-circuit adjusts output signal intersection voltage by adjusting the output signal rise and fall time of the serial data output sub-circuit;

wherein the serial data output control sub-circuit outputs a post-adjust serial data.

10. The transforming system between parallel data as claimed in 9,

Wherein the clock input sub-circuit includes a first clock signal terminal and a second clock signal terminal;

wherein clock signals input to the first clock signal input terminal and the second clock signal input terminal are inverted clock with each other;

wherein the clock control sub-circuit includes:

a first switching element;

a second switching element;

a third switching element; and a fourth switching element;

wherein the second clock signal terminal electrically controls the first switching element and the third switching element;

wherein the first clock signal terminal electrically controls the second and the fourth switching element;

wherein the serial data output control sub-circuit includes a fifth switching element and a sixth switching element to speed up the output signal falling edge flip and a seventh switching element and an eighth switching element to limit output signal amplitude.

* * * * *